United States Patent [19]
Hasbun

[11] Patent Number: 5,541,886
[45] Date of Patent: Jul. 30, 1996

[54] METHOD AND APPARATUS FOR STORING CONTROL INFORMATION IN MULTI-BIT NON-VOLATILE MEMORY ARRAYS

[75] Inventor: Robert Hasbun, Shingle Springs, Calif.

[73] Assignee: Intel Corporation, Santa Clara, Calif.

[21] Appl. No.: 364,307

[22] Filed: Dec. 27, 1994

[51] Int. Cl.$^6$ .................................................. G11C 13/00
[52] U.S. Cl. ............................ 365/230.01; 365/189.04; 365/230.03; 365/230.04; 365/230.05
[58] Field of Search ........................ 365/189.01, 189.04, 365/189.05, 230.03, 230.04, 230.05, 230.06, 230.08

[56] References Cited

U.S. PATENT DOCUMENTS 5,394,362  2/1995  Banks ........................................ 365/45

OTHER PUBLICATIONS

Robinson, Kurt, "Trends in Flash Memory System Design", *Wescon Conference Record*, Nov. 1990, pp. 468–472.

*Primary Examiner*—Terrell W. Fears
*Attorney, Agent, or Firm*—Blakely, Sokoloff, Taylor & Zafman

[57] ABSTRACT

A memory array circuit including a plurality of non-volatile memory cells adapted to selectively store data in either single bit mode or a multi-bit mode, control circuitry for causing control information data to be stored in first preselected ones of the plurality of cells and other data to be stored in other preselected ones of the plurality of cells, and circuitry for accessing the plurality of cells to read, program and erase the cells, the accessing circuitry functioning to access cells for storing control information data in single bit mode and cells for storing other data in either single bit or multi-bit mode.

10 Claims, 7 Drawing Sheets

FIGURE 6b

METHOD AND APPARATUS FOR STORING CONTROL INFORMATION IN MULTI-BIT NON-VOLATILE MEMORY ARRAYS

BACKGROUND OF THE INVENTION

1. Field of the Invention

This invention relates to flash EEPROM memory arrays, and more particularly, to methods and apparatus for storing control information used in programming and reading advanced flash EEPROM memory arrays which are capable of storing more than one bit of data in each memory cell.

2. History of the Prior Art

Recently, flash electrically-erasable programmable read only memory (flash EEPROM memory) has been used as a new form of long term storage. A flash EEPROM memory array is constructed of a large plurality of floating-gate metal-oxide-silicon field effect transistor devices arranged as memory cells in typical row and column fashion with circuitry for accessing individual cells and placing the memory transistors of those cells in different memory conditions. The memory transistors may be programmed by storing a charge on the floating gate. This charge remains when power is removed from the array. The charge level may be detected by interrogating the devices. Flash EEPROM memory arrays may be designed to provide a smaller lighter functional equivalent of a hard disk drive which operates more rapidly and is not as sensitive to physical damage. Flash EEPROM memory arrays are especially useful in portable computers where space is at a premium and weight is extremely important.

As originally devised, each flash EEPROM memory device stores a single bit of data. If a flash EEPROM memory device is programmed so that a significant charge is stored on the floating gate, the state is typically referred to as a "zero" or programmed state; while if little or no charge is stored on the gate, this is typically considered a "one" or erased state. Recently, it has been discovered that the transistor devices used for flash EEPROM memory arrays may be made to store charge at a number of discrete levels greater than the charge level of the erased state. Essentially, more than two discrete levels of charge (including the erased level) may be stored on the floating gates of the devices during programming and erasing by varying the voltages applied to the terminals of the devices and the duration of application; and these different charge levels (device conditions or states) may be detected. This allows flash EEPROM devices in memory arrays to store more than one bit per device and radically increases the storage capacity of such arrays. A device used in this manner is referred to as a multi-bit cell.

There are a number of problems which arise from the storage of more than one bit of data by a flash EEPROM cell. Because the maximum charge which may be stored on the floating gate is essentially fixed for any particular memory device, the differences between charge levels which indicate the different data values stored by the device are much smaller when a number of levels are stored. The different charge levels are sensed by comparison to charge levels stored by reference cells. Over time, charge tends to leak from the floating gates of the memory devices. What would be relatively minor leakage from the floating gate of a device storing only a single bit of data may change the charge level sufficiently to produce an incorrect value for comparison to a reference charge level in a device arranged to store a number of different charge levels. Consequently, there is chance for more errors to be caused by charge leakage from the floating gates of individual flash EEPROM devices arranged to store a number of different charge levels.

This increase in errors has a deleterious effect beyond what might be expected on flash EEPROM memory arrays. In one embodiment of long term flash EEPROM memory, the memory array is divided into a plurality of blocks the cells of each of which are erased simultaneously. Within these blocks, data sets are stored of a size usually much smaller than that of a block of flash EEPROM memory. In one embodiment, these data sets are stored in sectors of a size matching those of a typical electro-mechanical hard disk drive. With each of these data sets is stored some control information used primarily for correctly reading or writing the data set. It is necessary that this control information be correctly stored and retrieved so that data may be accurately written and retrieved from a flash EEPROM memory array.

In order to preserve the validity of data and allow the storage of more than one bit per memory device, error detection and correction (EDC) codes may be stored with the data stored in each data set in a flash EEPROM memory array. This error detection and correction code allows correction to be made to data which has failed due to leakage or other cell problems. Unfortunately, error detection and correction code uses a substantial portion of a flash EEPROM memory. In fact, some portion of the array is required to store the error detection and correcting bits with each data set in the array. Error detection and correction codes can require a very extensive amount of memory space if a number of different errors in the same data set are to be corrected. In one embodiment, ten bytes of error detection and correction code are used with each data set of 512 bytes allowing detection of six errors, and correction of five errors. Space required to store an equivalent error detection and correction code for what may be less than eight bytes of control information stored for each data set would be prohibitive. Furthermore, a significant increase in hardware or software is required to implement the application of the error detection and correction code to the control data fields. Also important, running an error detection and correction code algorithm requires a significant portion of the operating time of the system. Since the control data may be constantly accessed during the use of the array, to place error detection and correction codes in control fields would slow the read and write operation of the flash EEPROM memory arrays significantly and might render multi-bit storage arrays commercially non-competitive. Because of this, a most essential portion of data stored in flash EEPROM arrays is the control data which allows the various data sets to be properly programmed and retrieved.

SUMMARY OF THE INVENTION

It is, therefore, an object of the present invention to provide apparatus and methods for assuring the integrity of the control information stored in flash EEPROM memory arrays used to store more than one bit of data per memory cell of the array.

It is another object of the present invention to provide apparatus and methods for eliminating the need for error detection and correction code in the control fields of flash EEPROM memory arrays used to store more than one bit of data per memory cell of the array while continuing to protect the control fields against errors.

These and other objects of the present invention are realized in an arrangement which provides means for controlling the writing and reading of data to and from a flash EEPROM memory array in a manner that the data is stored in multi-bit per cell format with error detection and correction code protection against data errors, while the control information is stored in a reliable single bit per memory cell format either completely without error detection and correction code or with a reduced error detection and correction code.

These and other objects and features of the invention will be better understood by reference to the detailed description which follows taken together with the drawings in which like elements are referred to by like designations throughout the several views.

NOTATION AND NOMENCLATURE

Some portions of the detailed descriptions which follow are presented in terms of symbolic representations of operations on data bits within a computer memory. These descriptions and representations are the means used by those skilled in the data processing arts to most effectively convey the substance of their work to others skilled in the art. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities.

Further, the manipulations performed are often referred to in terms, such as adding or comparing, which are commonly associated with mental operations performed by a human operator. No such capability of a human operator is necessary or desirable in most cases in any of the operations described herein which form part of the present invention; the operations are machine operations. Useful machines for performing the operations of the present invention include general purpose digital computers or other similar devices. In all cases the distinction between the method operations in operating a computer and the method of computation itself should be borne in mind. The present invention relates to a method and apparatus for operating a computer in processing electrical or other (e.g. mechanical, chemical) physical signals to generate other desired physical signals.

In this specification, a signal which includes a "#" in its name is considered to be an active low signal. The term "assert" as applied to a signal indicates that signal is active independent of whether the level of the signal is low or high. The term "de-assert" indicates that a signal is inactive.

DETAILED DESCRIPTION

Figure 1:
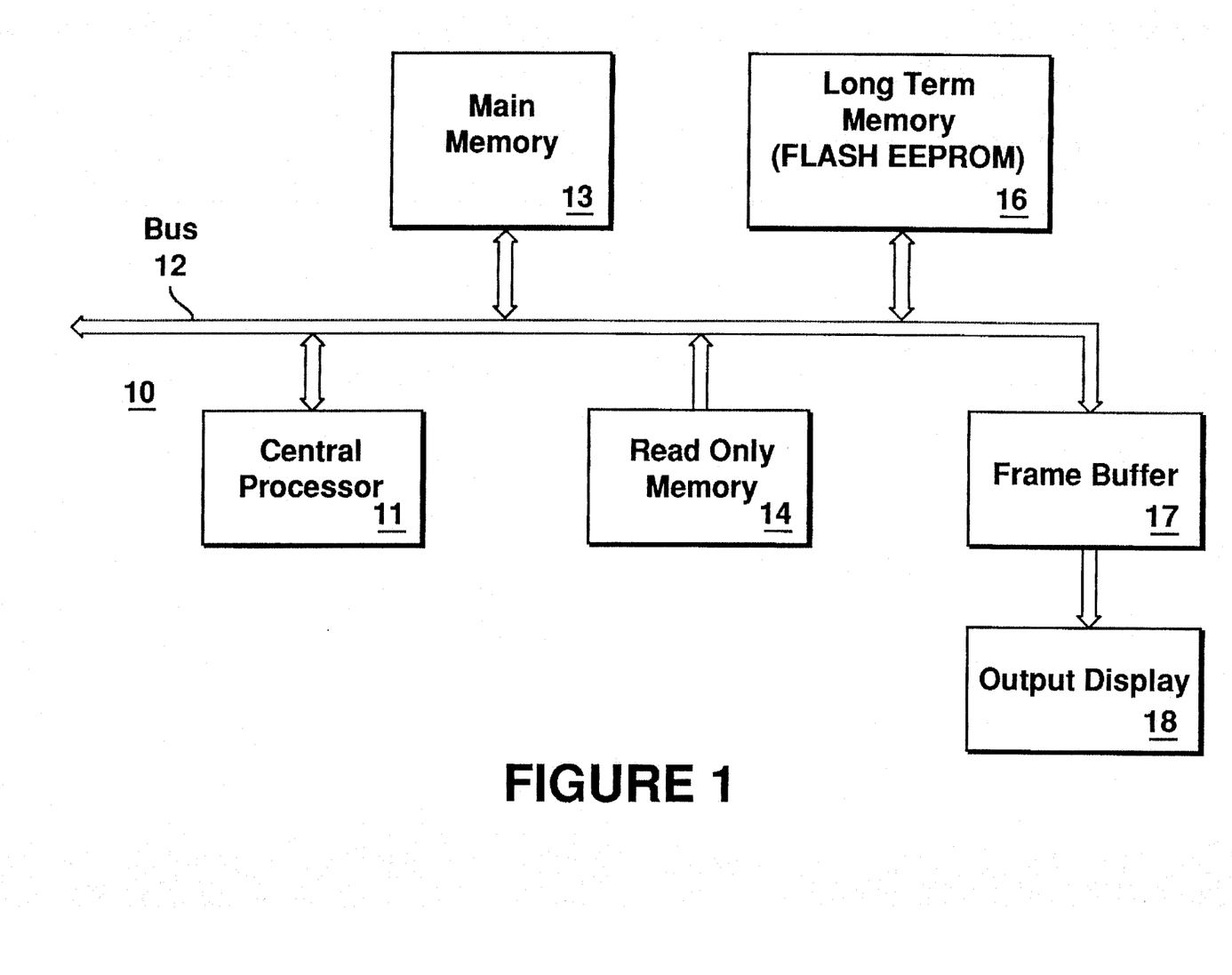
FIG. 1 is a block diagram of a computer system which may utilize the present invention.

Referring now to FIG. 1, there is illustrated a block diagram of a digital system 10 configured in accordance with one embodiment of the present invention. The present invention has application in any system utilizing a multi-level memory (a memory in which a memory cell may store more than one binary bit), such as a computer system. A portion of such a system 10 may include a central processing unit 11 (or other controller) which executes the various instructions provided to control the operations of the system 10. The central processing unit 11 is joined to a bus 12 adapted to carry information between the various components of the system 10. Joined to the bus 12 is main memory 13 which is typically constructed of dynamic random access memory arranged in a manner well known to those skilled in the prior art to store information during a period in which power is provided to the system 10.

Also connected to the bus 12 are various peripheral components such as long term memory 16 and circuitry such as a frame buffer 17 to which data may be written which is to be transferred to an output device such as a monitor 18 for display. Rather than the electro-mechanical hard disk drive which is typically used for long term memory, a flash EEPROM memory array may be used as the long term memory 16. Alternatively, a flash EEPROM memory array may be used to supplement the storage provided by an electro-mechanical hard disk drive or as storage for some other portion of the system. Such a flash EEPROM memory array may be a multi-level memory system (a memory system in which a memory cell may store more than one binary bit per device) and may include circuitry for controlling the operation of the memory array including all of the operations associated with reading, programming (writing), and erasing the memory array.

Figure 2:
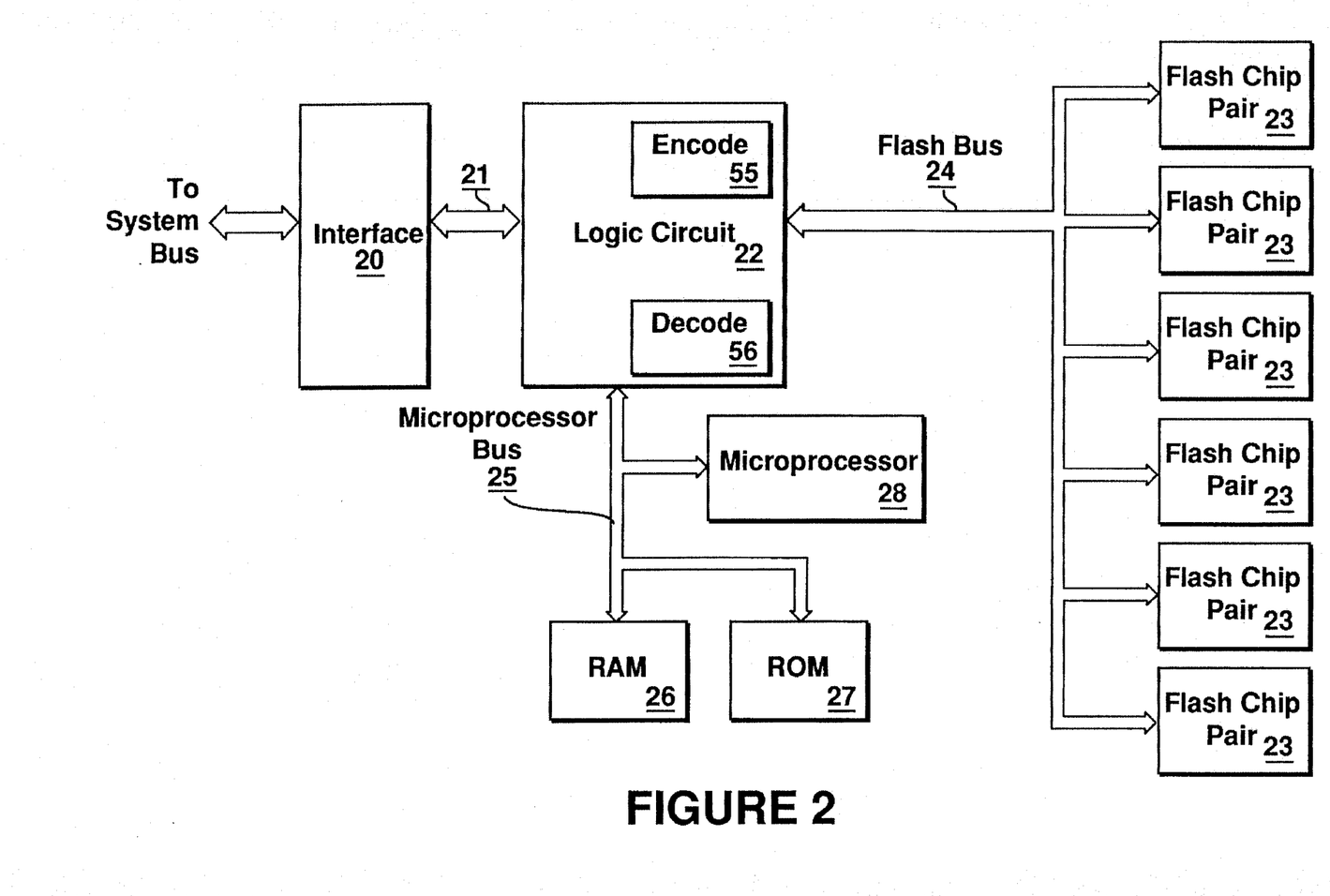
FIG. 2 is a block diagram of a flash EEPROM memory array constructed in accordance with the present invention.

FIG. 2 illustrates in block diagram form a flash EEPROM memory array which may be used as the memory system 16 illustrated in FIG. 1 or as some other memory in the system 10. The memory system 16 is joined to the bus 12 through an interface 20. The interface 20 provides appropriate circuitry for providing signals furnished on the bus 12 to a flash system bus 21. The flash system bus 21 transfers signals between the interface 20 and a logic circuit 22. In one embodiment, this logic circuit 22 is an application specific integrated circuit (ASIC) which provides logic for implementing and coordinating the various operations of the flash memory system 16 such as reading, writing, erasing, and determining the status of the various portions of the flash EEPROM memory array. The logic circuit 22 functions as a command center and controls operations occurring in a plurality of flash EEPROM chip pairs 23 via a flash bus 24 so that those chips function together as a long term memory system. The logic circuit 22 is assisted in its operations by a microprocessor 28 which is associated on a microprocessor bus 25 with random access memory (RAM) 26, and read only memory (ROM) 27. In one embodiment the microprocessor 28 is an Intel 80188 microprocessor manufactured by Intel Corporation of Santa Clara, Calif. For the purposes of the present invention, the microprocessor 28 utilizes random access memory 26 and read only memory 27 to function essentially as a general purpose processor in a manner well known to those skilled in the prior art. In order to carry out the functions of the flash EEPROM memory array, programs used in the various operations such as read, write, and erase may be stored in ROM 27 and executed by the microprocessor 28.

Figure 3:
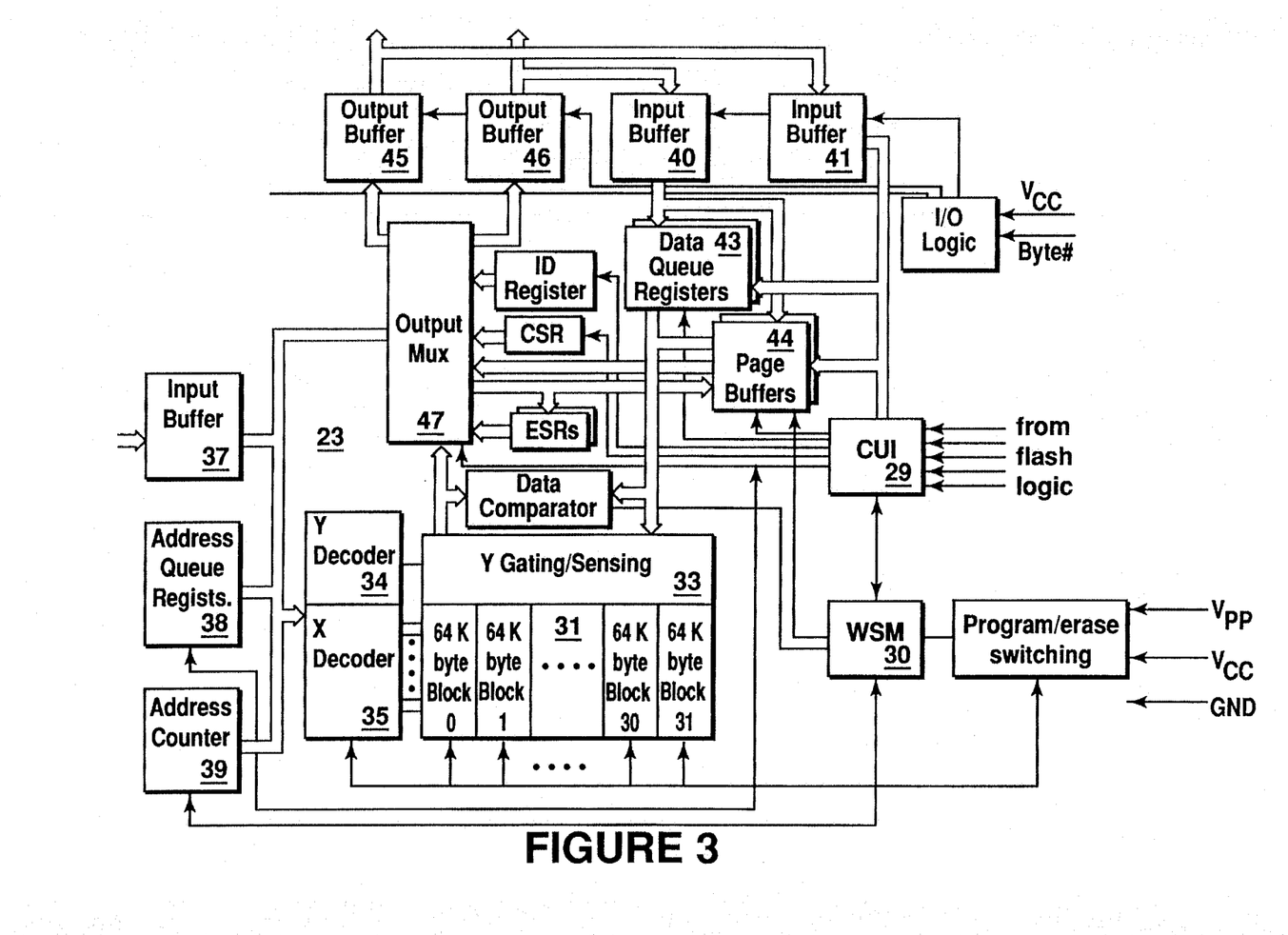
FIG. 3 is a block diagram illustrating a pair of memory chips and control circuitry used in the memory array illustrated in FIG. 2.

In one embodiment, each pair of flash EEPROM memory chips 23 together provides thirty-two blocks of memory transistors. Each chip of the pair 23 includes one-half of the memory transistors of the thirty-two blocks and control circuitry for effecting, among other things, read, write, and erase operations in the individual memory cells of the blocks on that chip pair 23. As is illustrated in FIG. 3 which shows one pair of flash chips upon which thirty-two blocks of the array may be situated, each flash chip pair 23 is joined to the flash bus 24 by a command user interface (CUI) 29. The user interface circuit 29 receives commands from the logic circuit 22 of the flash system 16 generated while programs are run by the microprocessor 28 and provides command signals to the chip pair 23. The user interface circuit 29 is not only an interface but a state machine designed to perform certain control function discussed hereinafter. The user interface circuit 29 is associated with a write state machine 30 which is utilized to control write operations and certain other internal operations of the chip pair 23. In one embodiment, the write state machine 30 includes a micro-controller including the typical registers, call stacks, program counter, and code and data storage areas to enable the execution of a number of commands which may be stored in the code storage area.

The chip pair 23 of FIG. 3 includes a flash EEPROM memory array 31 which in the embodiment illustrated includes thirty-two individual blocks each including sixty-four kilobytes of flash EEPROM memory cells. As is shown in the figure, the array 31 includes Y gating/sensing circuitry 33 for controlling the bitlines and output sensing devices of the array 31. Y decoder circuitry 34 furnishes address information to the Y gating/sensing circuitry 33, while X decoder circuitry 35 furnishes addresses used to select wordlines during flash memory accesses. Addresses are furnished from the flash bus 24 to the flash chip pair 23 at an address input buffer 37 which with an address queue register 38 and an address counter 39 controls the transfer of addresses to the chip pair 23.

Data is furnished from the flash bus 24 to the chip pair 23 at a pair of input buffers 40 and 41 from which it may be transferred to a data queue register 43 or to a pair of page buffers 44. Each of the data queue registers 43 and the page buffers 44 provide a direct path to the array 31 under control of the write state machine 30. The page buffers 44 allow relatively large amounts of data to be accumulated and then written to the array 31 or to the host more rapidly than would be possible using individual read and write operations for each data word. Data is transferred to the system on the flash bus 24 from the array 31 through a pair of output buffers 45 and 46 using an output multiplexor 47 which is controlled by the command user interface circuit 29. The multiplexor 47 also allows the transfer of various system information from the page buffers 44, from an ID register, and from various other internal circuitry such as status registers (CSRs and ESRs in the figure) under control of the command user interface circuit 29. The status registers may be read to determine the status of an operation such as write or erase, whether the operation is complete, and whether it has been completed successfully. These status registers also provide information regarding the state of each chip, the state of each block in a chip, the state of the command queue, and the mode in which the chip is operating. A hardware data comparator 48 includes circuitry which functions with the command user interface circuit 29 to compare addresses furnished with any command to the chip pair 23 with the addresses on each block of the chip pair so that a logical address may be rapidly accessed.

The command user circuit 29 of the memory chip pair 23 receives a number of commands from the flash system logic circuit 22. These may be categorized as read commands, write commands, and memory system maintenance commands. The read commands are executed within the chip pair 23 entirely under control of the circuit 29. The write commands and many of the maintenance commands are executed by the circuit 29 using the write state machine 30. This is especially true in embodiments in which the write state machine 30 includes a programmable micro-controller.

As is shown in FIG. 3, each chip pair 23 of the array 31 is divided into a plurality of blocks of memory. In general, a flash EEPROM memory array is divided into blocks which are connected so that each entire block of memory cells may be erased simultaneously. With N-type complimentary metal-oxide-silicon (CMOS) memory devices, this erasure is typically accomplished by a high voltage value applied simultaneously to the source terminals of all the memory transistors of a block while the gate terminals of the devices are grounded and the drain terminals are floated. Such an erasure places each of the devices of the block into the erased condition. When in the erased condition, a device may be programmed to place a particular charge level on the floating gate. Historically, only one charge level greater than the erased level was utilized; and this level has been referred to as a "zero" or programmed condition. The erased state has been called a "one" or erased condition. A device used to store charge at only these two charge levels is capable of storing a single bit of data. More recently, it has been found that a number of levels of charge in addition to the erased level may be stored on the floating gate of a flash EEPROM device. With three charge levels in addition to the erased condition, a device can store two bits of data.

Whether one or more bits are stored by a device, since all of the source terminals of the memory transistor devices of a block of the array are joined together, a device in a charged state cannot be switched to the erased state until the entire block of the array is erased once again. Thus, while an electro-mechanical hard disk drive typically stores information in a first area of the disk and then rewrites that same area of the disk when the information changes, this is not possible with a flash EEPROM memory array without erasing all of the valid information that remains in that portion of the array along with the invalid information. Consequently, in some arrangements, when the information at a data entry changes, the changed information is written to a new location on a block of the array containing empty (erased) cells rather than written over the old data; and the old data is marked as invalid. Then, after a sufficient amount of a block has been marked invalid, the entire block is erased. Data written to some block of the array which contains empty cells progresses sequentially through the block until the block has been filled with data sets.

Because of this arrangement by which data is replaced, each block of the array will after some time have a number of entries which are marked as invalid and cannot be used for storage. Consequently, the array fills with data as the data previously stored is changed; and a point will come when it is necessary to clear the invalid information from a block in order to provide space for new or changed information to be stored. When erasure of a block is required, all of the remaining valid data stored in the block to be erased is written to blocks with empty space; the space from which the data was read is marked invalid; and then the entire invalid block is erased (cleaned up) and put back into use as a clean block of memory.

It typically takes as much as a second to erase a block of an advanced flash EEPROM array. However, because erasure need not occur with each entry which is rewritten, erasure may be delayed until a block contains a sufficient amount of invalid information that cleanup is feasible. This reduces the number of erasure operations to a minimum and allows erasure to occur in the background when the facilities for controlling the array are not otherwise occupied with reading and writing.

Because of this arrangement by which data is replaced in the array by writing it to a different physical position, the physical address at which data is stored varies constantly. To indicate where specific data is stored, a logical address is assigned to and accompanies the data. Depending on the system implementation, this logical address may be the same address as is used by the host computer. The controller then determines the actual address of the data when the data in the array 10 is read or written.

Figure 4:
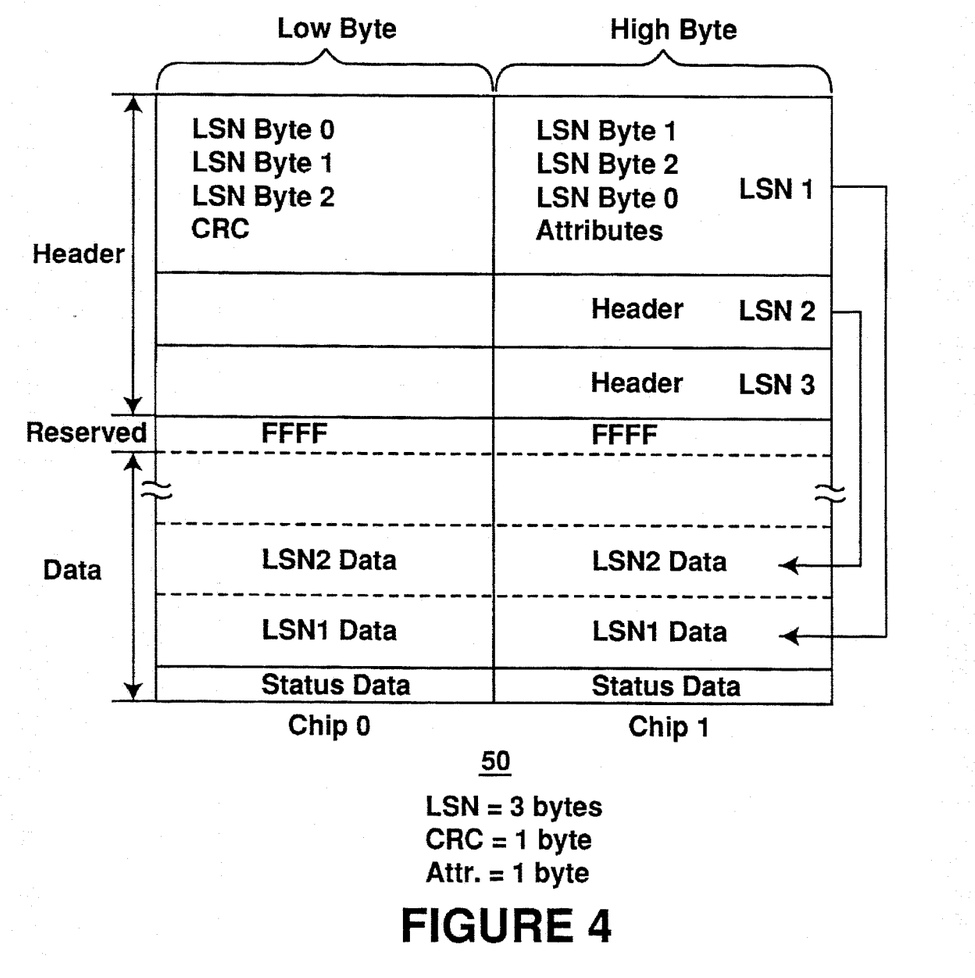
FIG. 4 is a diagram illustrating the arrangement of control information and data in a single block of a memory array constructed in accordance with the present invention.

FIG. 4 is an idealized drawing which illustrates one embodiment of an individual block of the array and is useful in describing the way data is stored. A typical block is illustrated as a large rectangular area. The area is divided into two individual physical chips (chip 0 and chip 1) in one embodiment. One of these chips stores all of the low byte data for all of the blocks while the other chip stores all of the high byte data for all of the blocks. In one embodiment, each chip has its own individual control circuitry including a separate control user circuit 29 and a separate write state machine 30. The area assigned on each chip for one block of the array includes a plurality of transistor devices typically arranged in rows and columns to provide the desired storage. The individual transistors and the various column and row select lines and other conductors for operating the block are not illustrated in FIG. 4 but are well known to those skilled in the art of designing flash EEPROM memory arrays.

As may be seen in FIG. 4, information is stored in each chip of block 50 beginning at the top of the block and continuing to the bottom. In block 50 are control fields which are referred to as identification fields or "headers." These identification fields store data including the logical addresses used to locate the data within the array. For example, in one embodiment, a three byte logical address is stored in the first header at the top of the block of the lower byte chip. In the figure, the logical address of the first data set stored in the first header is shown as "LSN1" although it might be any number within the range of the array. Control information is stored in single bit mode, and a one byte cyclical redundancy check (CRC) value may be stored in the header along with the logical address of the data set on the lower byte chip. The same logical address is also stored in a different three byte order in the header portion of the high byte chip along with a set of attributes. The attribute byte includes bits indicating whether data is stored in the data area below the header, whether the block is to be considered bad and unusable, a revision number, and the mode of storage. These fields allow the accurate retrieval of data in the array.

As mentioned, a CRC value is used to detect control field errors in the flash EEPROM array. This is because the control field is stored in the much more reliable single bit mode. A cyclical redundancy check uses a math function to compute a CRC value which is unique to the control field stored and stores that value with the control field. When the control field is read, a new CRC value is computed from the same control field and compared to the CRC value stored with the control field. If the values are not equal, some change has occurred in the control field since it was stored. Although a cyclical redundancy check detects errors, it does not correct the errors which it detects. A cyclical redundancy check, however, will be more than sufficient where only a single bit of data is stored in each cell because of the very high reliability of single bit data storage in flash media. Where multiple bits of data are stored in a cell, the charge loss window is reduced and a CRC check is insufficient.

Immediately below the first header for data set LSN1 are stored header data for each of the other data sets stored on the particular block of the array. Typically, several hundred data sets are stored in a block of the array. Below the portion of the block including the headers are stored the data for each of the data sets having headers at the top. In one embodiment, the data for data set LSN1 is stored at the bottom (in the figure) of the data portion of the block. Then the data for the next header from the top (data set LSN2) is stored next above the data for data set LSN1. This format continues throughout the block. Arrows in FIG. 4 illustrate the physical position at which the data for each of the data sets is stored. In the case of data set LSN1, which is the first data set on the block, the data is written at a position indicated by the arrow leading from the header to a point near the bottom of the entire data storage area. FIG. 4 also shows a second arrow from the header for the data set labeled LSN2 to a physical position on the block which stores the data for data set LSN2. As may be seen, since the data sets of data for the headers stored above in the block are written from the bottom of the block up, an erased area is left between the headers and the data. If this area is read, it produces all "one" values which may be interpreted as the hexadecimal values FF, FF . . . . These values may be used in managing the array.

At the very bottom of the block is stored additional status information useful in maintaining the array. In this area may be stored bits providing an indication (referred to as "questionable") of where problems have occurred in accessing the block previously, and even suggesting that the block may be bad and should be removed from service.

The manner in which the array is accessed during read and write operations in single bit mode may be understood by considering FIGS. 3 and 4. Before use, each of the blocks of the array is formatted to contain a header, empty storage space for data for each data set of 512 bytes which the block is able to store, and a status area. All of the data sets of most of the blocks in array 31 are numbered when initially formatted with logical addresses in serial order beginning at some first block and proceeding through all of the blocks. However, a few blocks are formatted with no information in the header areas. Consequently, most of the individual data sets within the flash chip pairs 23 will contain logical addresses and space for data whenever a read or a write operation is begun. In a read operation it is necessary to find the physical location of the data set in order to read the data stored in the data set. In a write operation, it is also necessary to find the data set so that the old data at this position may be invalidated while the new data is written to a new physical position which receives the same logical address as the old data set. In either a read or a write operation, a command for the operation and a logical address are furnished so that a search may be conducted.

With either a read or a write operation, a command word is also furnished to the circuit 29 to be used in a search for the header of the data set containing the data being accessed. This command word includes information regarding a search for the header including whether one or two words are sought, whether the search is in single-bit or multi-bit mode, and how many words to increment. The circuit 29 causes a search for the header of the data set in the array to be conducted using the data comparator 48 by searching each block from the top of the header area down until the logical address in the header is found or is found to be absent from the block as is signified by the return of a data value of "FF, FF" from the area immediately below the header area of the block. The circuit 29 uses the circuitry of the data comparator 48 and the command word information to rapidly compare an address furnished with any command and the logical addresses stored in the header areas on each block of the chip pair in physical sequence so that a logical address may be rapidly accessed.

If the logical address is not found during a search of a block, the comparator 48 indicates this to the circuit 29; and the search is continued in the next block. When the logical address is found on a block, the block and offset of the header of the data set are transferred back from the comparator 48 to the page buffer with an indication that the data set has been found. The circuit 29 looks at the attribute information to determine whether the data set is bad, the mode of data storage, and so on. For a read operation, the circuit 29 uses this address to accomplish the read operation. For a write operation, whether an initial write or an update of data, the new data is written to an empty location somewhere else in the array, but the write operation uses the attribute information to accomplish this write and ultimately marks the old header of the data set which is found in the search as invalid.

When the operation which occasioned the logical address search is a read operation, the logical address is furnished to the page buffer along with the CRC value. The search is conducted and a CRC value found in the header is compared to a new CRC value computed using the logical address of the data set. If these compare, the header is valid and may be read. If these do not compare, the header is invalid and is so indicated.

When the operation occasioning the logical address search is a write operation, the data to be written will have been furnished to the page buffers 44 of the chip pair 23. The write command and the logical address to which data is to be written are furnished to the circuit 29 and used by the write state machine. The interface causes the search to be conducted and the attributes of the old data set are recovered. The data in the page buffer is written to the data area of an unused data set of a block having empty space. The header area of this unused data set is written by the write state machine. The write state machine uses the logical address to compute a CRC value and stores that in the header with the logical address of the data set. Since the new data has been furnished to write a previously unused data set location, and a new header has been constructed for the data set, the write state machine 30 marks the data set containing the old data found on the block as invalid once the new data has been safely stored.

This operation occurs each time data in any data set is changed. The logical address is furnished to the page buffer 44 using the input address buffer 37. The circuit 29 conducts a search to find the physical position of the header containing the logical address. The attributes of the header are checked to validate the data set's attributes, and the new header and its associated data are written by the write state machine 30 to an empty location somewhere on one of the blocks of array 31. Once this has occurred, the header of the old data set is marked invalid; in one embodiment, this is accomplished by writing the first two words of the logical address to zero on each of the two chips of the block.

Whenever a data set is marked invalid, the invalid data set is left to be cleaned up at some later time when a sufficient amount of flash on the block has been marked as invalid. Because the space marked invalid on a block cannot be erased and reused until the entire block is erased, each block of the array will after some time have a number of header entries which are marked invalid and cannot be used for storage. The amount of this invalid space will mount as the array is used to store new data. After some period of use, a sufficient amount of invalid data will exist on a block such that it will be desirable to release space for data yet to be stored by moving any remaining valid information from the block to some other block and then erasing the block. The process of moving valid data to other blocks and erasing a block which contains only invalid data is referred to as "cleaning up a block" and has the effect of freeing an additional amount of flash memory equal to the sum of the sizes of all of the data sets on the erased block which have previously been marked as invalid.

Figure 5:
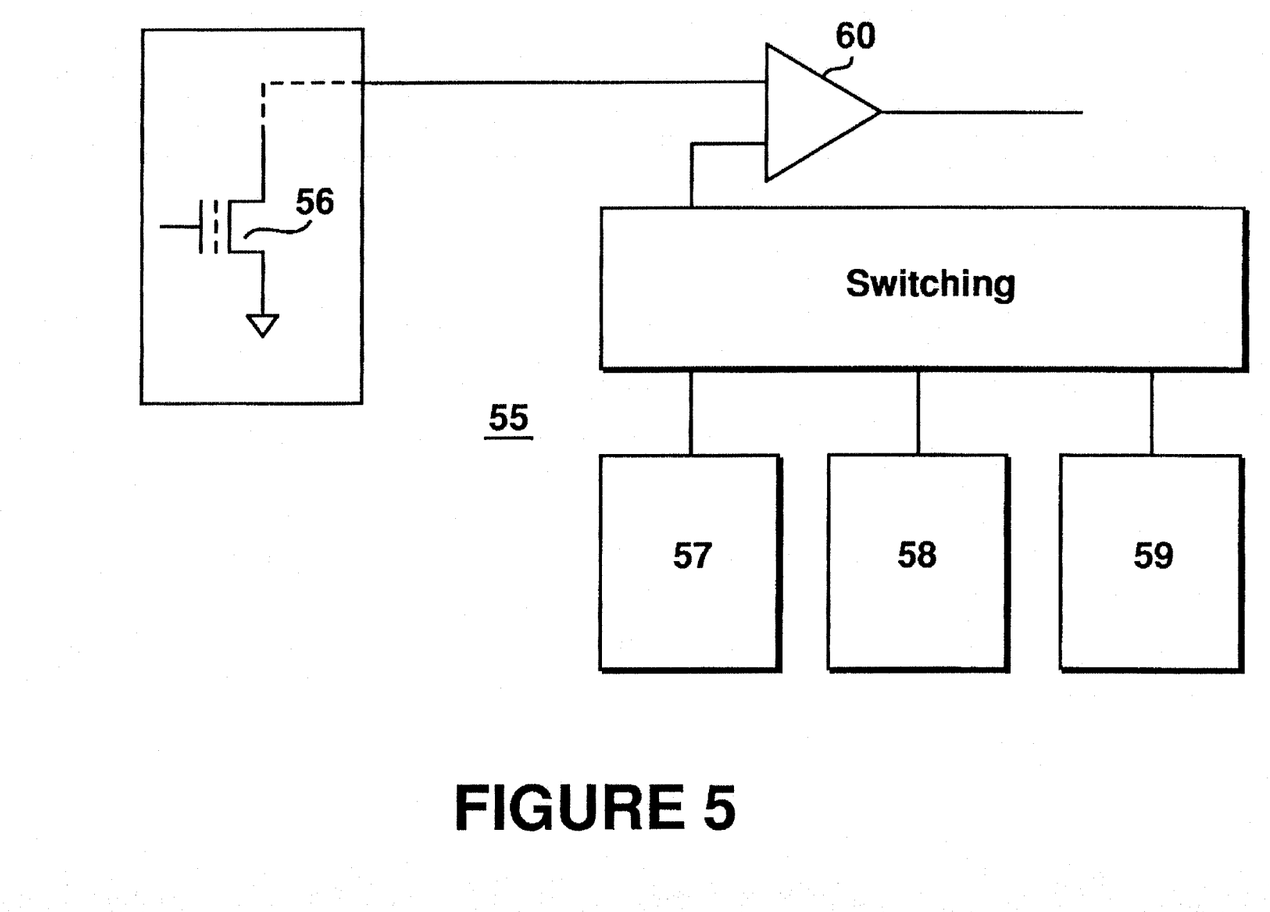
FIG. 5 is a block diagram illustrating circuitry of the present invention which allows the concurrent operation of single and multi-bit modes in blocks of the same flash EEPROM memory array.

An arrangement has been devised which allows the individual memory cells of a flash EEPROM memory array to be operated in either single or multi-bit mode. FIG. 5 illustrates a block diagram of a circuit which illustrates the essence of such an arrangement 55. The value of a charge stored by a memory cell 56 is compared at a sense amplifier 60 to a value of a charge stored by one of a number of references cells 57, 58, 59. The reference cells are each connected in a circuit similar to the circuit of a bitline in which the memory cells are connected. The charge value stored by a reference cell is compared by a sense amplifier to the charge value stored by any selected memory cell 56. When a cell is operated in two bit mode, the charge stored by the memory cell 56 is compared to the charged stored on only one of the reference cells 57. If the charge stored by the memory cell 56 is less than a first level stored by the reference cell 57, the sense amplifier 60 provides an output signal to indicate that the cell is erased. If the charge stored by the memory cell 56 is greater than that stored by the reference cell 57, the sense amplifier 60 provides an output signal to indicate that the cell is programmed.

In its simplest form, the additional reference cells 58 and 59 each stores a charge at a different level from the first level, e.g., one higher level and one lower level. The charge stored by any memory cell 56 may be compared by the sense amplifier to each of these reference levels to determine the level of charge stored by the memory cell. If three reference levels are provided, four different charge levels above and below each of the reference levels may be sensed on the floating gate of a memory cell 55. These additional reference cells allow the memory cells to be used for multi-bit storage.

When a memory device is being written, the sense amplifier tests whether the charge on the floating gate of the memory device has reached a correct level compared to the desired reference level, and charging continues until the correct reference level is reached. When reading, the memory device charge level is compared to one or more of the reference cell levels depending on whether the mode is single bit or multi-bit.

In order to operate the array in single bit mode, a signal is provided to switch the first reference cell 57 into operation. In order to operate the array in multi-bit mode, a signal is provided to switch the ones of the plurality of reference cells into operation in appropriate order. In one embodiment, this signal is a configuration command which occurs at various instances during the read, write, search, and other operations. These operations are controlled by the read, write, cleanup, and other programs or processes which are stored in ROM 27 and are executed by the microprocessor 28. The microprocessor 28 responds to the steps of the programs by transferring the configuration commands to the command user interface circuit 29 of the appropriate flash chip pair 23 at the appropriate instances of each operation; the circuit 29 then causes the flash chip pair 23 to function in single bit or multi-bit mode. Before this invention, the flash EEPROM array was always programmed and read in either single bit or multi-bit mode, but never operated in both modes during a single operation, nor operated in such a fashion that both single and multi bit data are stored in the same array.

We have devised an arrangement which makes use of this facility to run in either single or multi-bit mode to obviate the problem created by the need to utilize error detection and correction code (EDC) whenever multi-bit programming takes place. It has been found that a flash EEPROM memory array may be operated in single bit mode when accessing control fields, and in multi-bit mode when accessing the data areas of the array. This allows the control fields to be written with either none or at most a minimized error detection and correction code and associated software and hardware needed to use that code. In fact, because of the extremely high reliability of single bit storage, no error correction mechanism need be used in the control fields. Instead, a CRC code which simply detects errors may be used in the control fields. The elimination of error detection and correction codes in control fields saves a significant amount of space in the array which may be used for data, drastically increases the speed of overall operation by removing the correction operation, and allows changes to made to control fields without the necessity of rewriting all of the control data with each change in order to compute new error detection and correction bytes. Writing logical addresses or tag fields in single bit mode allows a search for the address or tag field to be instituted without the need to compute an error detection and correction code for each logical address or tag field searched.

As will be understood from the foregoing discussion, the present invention removes the need to use error detection and correction code with the control fields stored in the headers in flash EEPROM memory arrays in multi-bit mode by accessing control fields in the header portion using single bit mode while accessing the data in the data storage portion of each block in multi-bit format. In order to accomplish this the present invention provides means for switching to single bit mode whenever the header portion of the array is accessed. This is accomplished by including as one of the various programs which are stored in ROM 27 or as a part of other programs which are operated by the microprocessor 28 a method for automatically switching the array to single bit mode whenever the header portion of the array is accessed.

As has been mentioned above, the microprocessor 28 issues a configuration command to switch to either the single bit or the multi-bit mode. Such a configuration command includes both the command itself and a configuration word in one embodiment. The configuration word includes a number of bits indicating the condition in which the flash chip pair (or pairs 23) is to operate. At least one bit of this configuration word may be used to indicate whether the operation is to be conducted in single bit or multi-bit mode. Of course, it is conceivable that a number of different multi-bit modes of chip storage might be made available (two bits, three bits, inter alia) and that more than one bit would be used to indicate the single bit and different multi-bit modes.

Certain aspects of these operations should be especially noted. Since the seek program is utilized in both read and write operations, and since the seek program deals only with accessing headers of data sets stored in the array, the seek program is provided an automatic routine for switching to single bit mode. This means that the seek program automatically provides a configuration command whenever a seek of a logical address within a header is to be undertaken.

Whenever a read operation involves the header portion of any data, the configuration command for placing the operation in single bit mode is utilized to assure that the read operation occurs in single bit mode. For example, in order to determine whether the control data which constitutes the header for a particular operation is valid, the header must be read. This requires that the header be read in single bit mode. Once the read of the header is complete, the next operation is switched to whatever mode is required for that operation. To read data in multi-bit mode after a header has been accessed, for example, the mode is switched to the multi-bit mode from single bit mode so that the data may be correctly read and sent to the error correction and detection circuitry.

Likewise, when a write operation is to be accomplished, the flash chip pair is placed in the proper mode for the portion of the operation to be accomplished. A seek for the header containing the correct logical address to be written is (as in other instances) conducted in single bit mode. In a similar manner, a write of the header to an empty location is accomplished in single bit mode and must be prefaced with a configuration command to place the particular chip pairs in that mode for the operation. However, the write of the data set data is accomplished in multi-bit mode and must similarly be prefaced by a configuration command to accomplish this purpose.

Figure 6A:
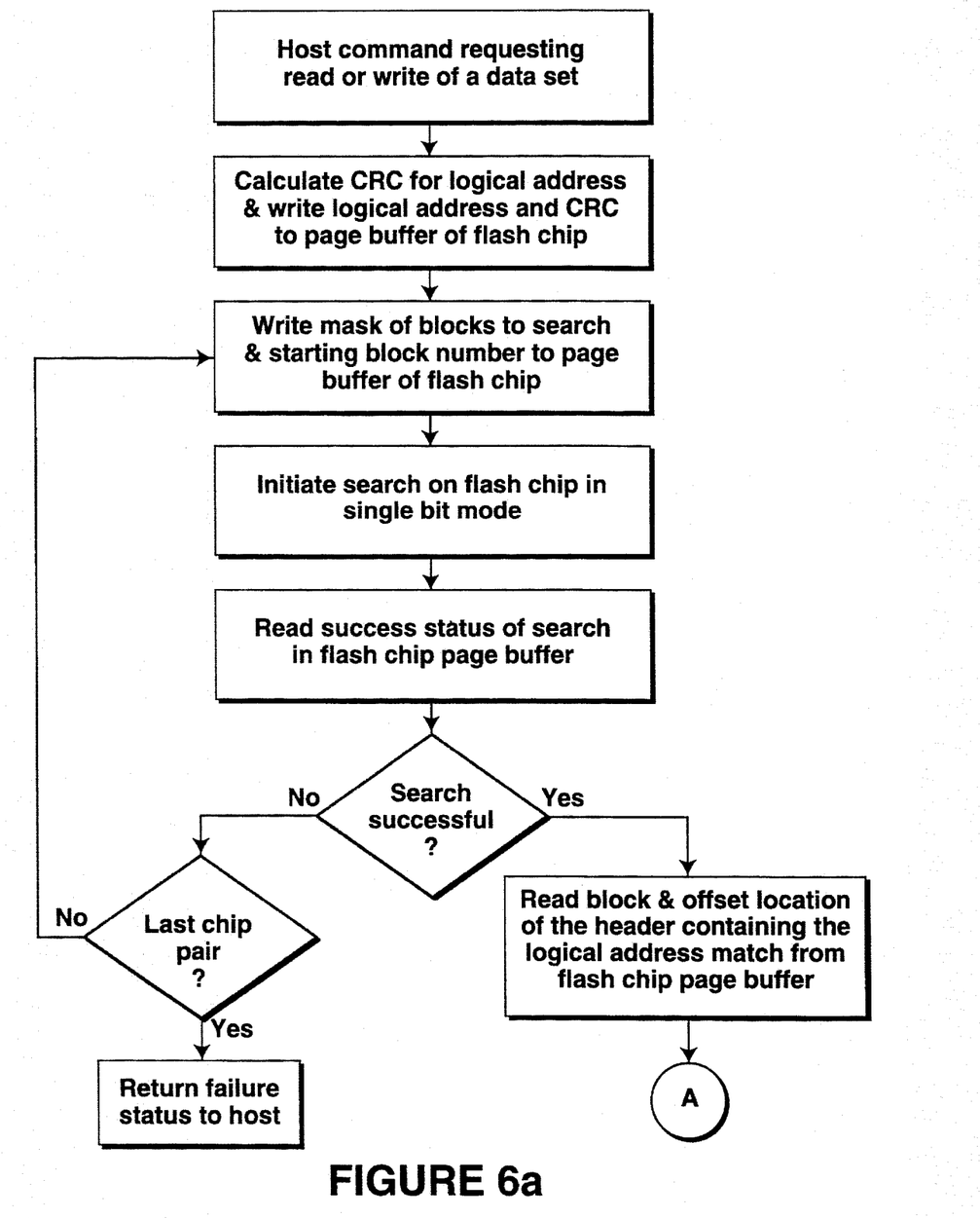
FIGS. 6(a) and 6(b) together form a flow chart illustrating read and write operations practiced using the method of the present invention.
Figure 6B:
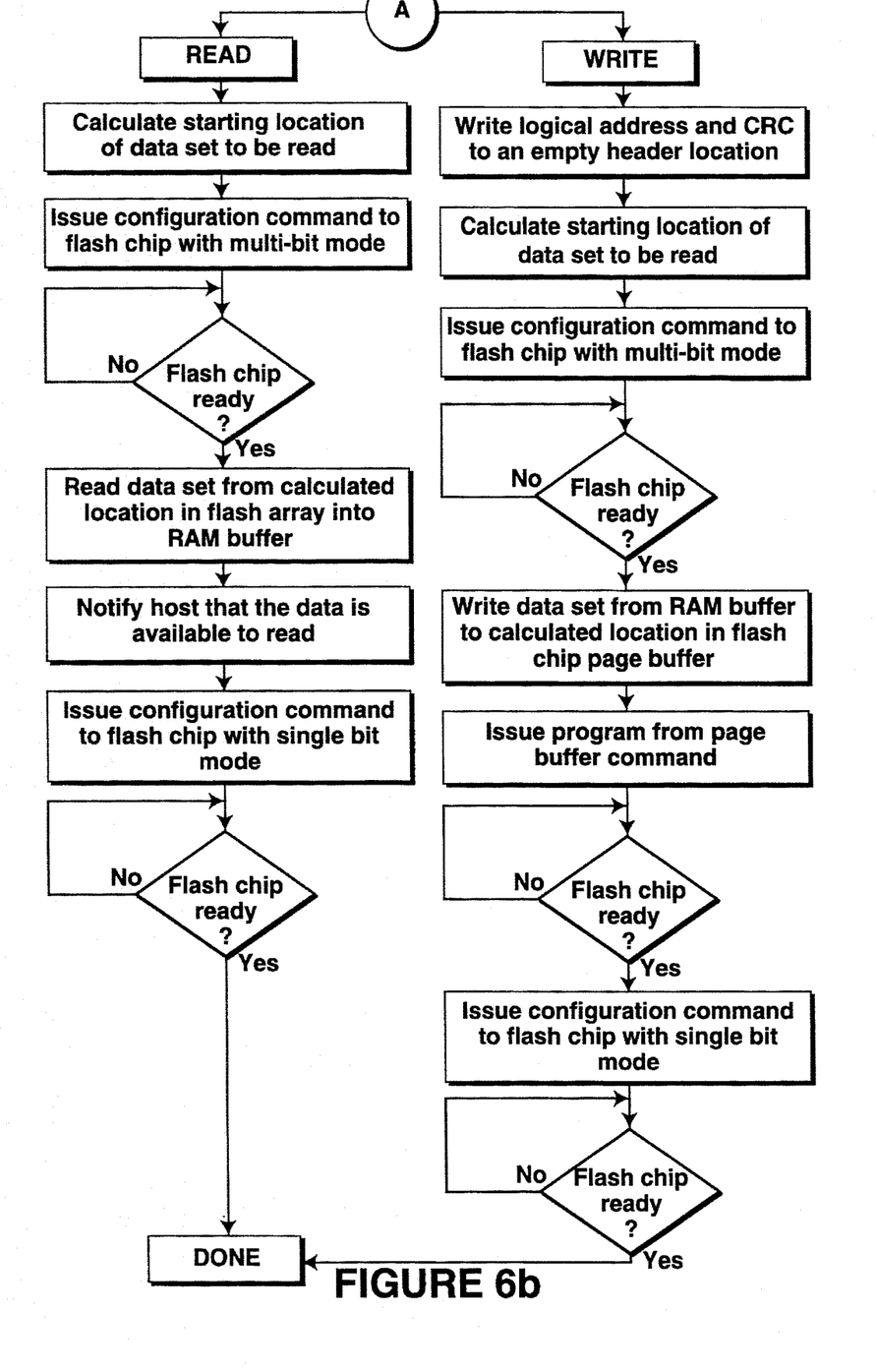

FIGS. 6(*a*) and 6(*b*) together form a flow chart illustrating a method of practicing the invention. As will be seen, this flow chart illustrates how and where the configuration commands are given in the operation of the flash EEPROM memory array in accordance with the present invention. As is illustrated in FIGS. 6(*a*) and 6(*b*), in a first step a host command requests a read of write of data to a particular logical address to accomplish a read or a write operation. This requires a step at which a CRC value is calculated for the logical address in the command. Both the logical address and the computed CRC value are written to the page buffer. Next, the blocks to search and the starting block number are furnished to the page buffer. A search is then initiated in single bit mode and the status of the search is read in the page buffer. If the search is not successful, the search is repeated until the last chip pair has been searched without success and at that time a failure is returned to the host. Whenever the search is successful, the block and offset address of the header containing the logical sector address match is furnished to the page buffer where it may be read by microprocessor 28.

Thus, a first step requires a seek operation be conducted in single bit mode. Once the seek is completed, the attribute information is derived from the header using single bit mode. The attribute information is used to determine whether the data set is considered by the host as bad, whether the data set is written in single or multi-bit mode, and other attributes not pertinent to this invention.

At this point, if the operation is a read, the starting location of the data set to be read is computed. Then a configuration command is issued to cause the operation to switch over to the multi-bit mode. After an appropriate time to ready the chip (busy is asserted by the flash chip during this time), the data set is read from the addressed location into the output buffers 35 and 36. After all of the data has been read from the data set, error detection and correction have been performed on the data, and the data has been transferred to the host, the read operation is compete.

If after a successful seek operation for a logical address in the header, a write operation is to be undertaken, the microprocessor 28 conducts a search for a new location in which to place the data set which is to be rewritten. This is accomplished by a search of available space held in a database in RAM 26. The database includes the last block in which data was written and the last physical position in that block to which the data was written. Once adequate empty space has been found, the write state machine (with the array still operating in the single bit mode) writes the logical address, the CRC, the attribute, and any other control values to the empty header location. When this occurs, the header of the new sector is marked as used. Microprocessor 28 then calculates the starting location of the data to be written. At this point, a configuration command is issued by microprocessor 28 to place the flash chip in the multi-bit mode. After an appropriate time for setting up the circuitry, the data set is written from the RAM 26 to the calculated location in the flash chip page buffer and a program (write) command is issued for the data. The data is then written (e.g., from the page buffer) to the data space of the new set area using multi-bit mode programming. Then the EDC code for that data is computed and appended to the data space to complete the writing of a data set in multi-bit mode. In one embodiment, this requires ten full bytes of code be written.

Although not illustrated in the flow chart, after the data has been written, the configuration command is given to place the flash chip in the single bit mode; and the old header is invalidated by writing in single bit mode zeroes to the first two words of the header area at the old position of the sector. At this point, the write operation is concluded.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. An apparatus comprising:

a memory array comprising a plurality of nonvolatile memory cells, wherein each cell can store more than one bit of information;

control circuitry for accessing the memory array in a selected one of a multi-bit mode and a single-bit mode, wherein the memory array stores data in one portion of the array and control information for the data in another portion of the array, wherein the control circuitry selects the single-bit mode when accessing the control information, wherein the control circuitry selects one of the single-bit mode and the multi-bit mode when accessing the data.

2. The apparatus of claim 1 wherein the data includes an error detection and correction value.

3. The apparatus of claim 1 wherein the control information includes a cyclic redundancy check value for the data.

4. The apparatus of claim 1 wherein the memory array includes flash electrically-erasable programmable read only memory cells.

5. A memory array comprising:

a plurality of nonvolatile memory cells arranged in separately erasable blocks, each block including an area for storing data and another area for storing control information associated with the data, wherein the nonvolatile memory cells can store more than one bit per cell; and circuitry for accessing the blocks using logical addresses stored as a part of the control information, wherein the circuitry accesses the control information in a single-bit mode and the circuitry accesses the data in a selected one of a single-bit mode and a multi-bit mode.

6. The memory array of claim 5 wherein the data includes an error detection and correction value.

7. The memory array of claim 5 wherein the control information includes a cyclic redundancy check value.

8. A method of accessing a selected set of data from a plurality of sets of data stored in at least one block of memory, comprising the steps of:

locating a logical address corresponding to a given address, wherein the logical address is located in control information stored in one portion of the block of memory, the memory including a plurality of nonvolatile memory cells, the control information stored in a single-bit per cell mode within the one portion of the block of memory;

accessing control information associated with the logical address in a single-bit per cell mode;

accessing the selected set of data within the block in accordance with the control information associated with the logical address, wherein the selected set of data is accessed in a multi-bit per cell mode.

9. The method of claim 8 further including the step of appending an error detection and correction value to the set of data.

10. The method of claim 8 further including the step of verifying the validity of the control information associated with the logical address by comparing a computed cyclic redundancy check value with a cyclic redundancy check value stored in the control information.

\* \* \* \* \*